(12) United States Patent
Lindemann et al.

(10) Patent No.: US 6,316,765 B1
(45) Date of Patent: Nov. 13, 2001

(54) DEVICE FOR DETECTING THE POSITION OF ROTATING OBJECTS

(75) Inventors: Eckhard Lindemann, Raisdorf; Thomas Zelenka, Mönkeberg, both of (DE)

(73) Assignee: Heidelberger Druckmaschinen, Heidelberg (DE)

( * ) Notice: Subject to any disclaimer, the term of this patent is extended or adjusted under 35 U.S.C. 154(b) by 0 days.

(21) Appl. No.: 09/708,287

(22) Filed: Nov. 8, 2000

Related U.S. Application Data

(63) Continuation of application No. PCT/DE99/01173, filed on Apr. 19, 1999.

(30) Foreign Application Priority Data

May 8, 1998 (DE) .............................................. 198 20 630

(51) Int. Cl.[7] ...................................................... G01D 5/34
(52) U.S. Cl. ..................................... 250/231.13; 356/614
(58) Field of Search .................. 250/231.13, 231.14, 250/231.18, 229; 356/614, 615, 621, 622, 624; 341/13

(56) References Cited

U.S. PATENT DOCUMENTS

| | | | |
|---|---|---|---|
| 4,056,722 | * 11/1977 | Ray | 250/231.13 |
| 5,903,000 | * 5/1999 | Juniman | 250/231.13 |

FOREIGN PATENT DOCUMENTS

| | | |
|---|---|---|
| 2 018 003 | 10/1970 | (DE) . |
| 1 673 973 | 6/1971 | (DE) . |
| 2 140 685 | 3/1972 | (DE) . |
| 32 33 101 C2 | 3/1984 | (DE) . |
| 39 01 876 A1 | 8/1989 | (DE) . |
| 195 16 154 A1 | 11/1996 | (DE) . |
| 296 17 149 U1 | 1/1997 | (DE) . |
| 0 439 804 A2 | 8/1991 | (EP) . |
| 818466 | 8/1959 | (GB) . |
| 1 297 980 | 11/1972 | (GB) . |
| WO 82/00196 | 1/1982 | (WO) . |
| WO 92/04661 | 3/1992 | (WO) . |

* cited by examiner

Primary Examiner—John R. Lee
Assistant Examiner—Kevin Pyo
(74) Attorney, Agent, or Firm—Herbert L. Lerner; Laurence A. Greenberg; Werner H. Stemer

(57) ABSTRACT

A device for detecting the position of rotating objects, having an optical signal transmitter and an optical sensor, includes a stationary light source provided in the optical signal transmitter for generating along an optical axis a light beam directed onto a rotating object, the optical sensor being stationary and being arranged on the optical axis on a side of the rotating object located opposite the optical signal transmitter, in the region of the optical axis of the signal transmitter and the sensor, the rotating object being formed with a diametrically extending bore having an entrance window for the light beam and an opposite exit window for the light beam, a slit diaphragm arranged in vicinity of the exit window, and an objective for focusing the light beam onto the slit diaphragm arranged in vicinity of the entrance window, the slit of the slit diaphragm being aligned with a transverse extent thereof at least approximately perpendicularly to an axis of rotation of the rotating object.

8 Claims, 1 Drawing Sheet

DEVICE FOR DETECTING THE POSITION OF ROTATING OBJECTS

CROSS-REFERENCE TO RELATED APPLICATION

This is a continuation of copending international application PCT/DE99/01173, filed Apr. 19, 1999, which designated the United States.

BACKGROUND OF THE INVENTION

1. Field of the Invention

The invention relates to a device for detecting the position of rotating objects, the device having an optical signal transmitter and an optical sensor.

Detecting the position of rotating objects, in particular, rotating shafts, is frequently performed in machine construction or engineering with the aid of reticles which rotate with the object and are evaluated by a sensor. It is thereby possible to determine the speed, position and, if appropriate, the direction of rotation of the rotating object.

Such devices, however, are not suitable for detecting position with high precision, such as is required, for example, in electronic reproduction technology when exposing recording material by an electronic recording unit, also known as a recorder or an image setter, in order to achieve a good recording quality.

A light beam modulated by an image signal is guided in a recorder over a recording material to be exposed in a punctiform and line-wise manner by a rotating light-beam deflecting device. In this process, the recording material is fixed on a holder which moves relative to the light-beam deflecting device. In order to attain a good recording quality, it is necessary to generate a reference pulse, by an exact position detection, by which the deflecting movement of the light beam and the transport of the recording material are synchronized.

A device for generating such a reference pulse has already been disclosed heretofore in the German Published Non-prosecuted Patent Application (DE-OS) 195 16 154. This known device has a fixed or stationary light source which generates a light beam directed onto a rotating object. The light beam is reflected by a mirror disposed on the rotating object onto a stationary optical sensor which generates an electric reference pulse at a defined angular position of the rotating object.

This heretofore known device, however, is also not adequately suitable for satisfying increased demands for accurate position detection.

SUMMARY OF THE INVENTION

It is therefore an object of the invention of the instant application to provide an improvement in a device for position detection so as to ensure that a position is marked accurately with a device having a simpler construction.

With the foregoing and other objects in view, there is provided, in accordance with the invention, a device for detecting the position of rotating objects, having an optical signal transmitter and an optical sensor, comprising a stationary light source included in the optical signal transmitter for generating along an optical axis a light beam directed onto a rotating object, the optical sensor being stationary and being arranged on said optical axis on a side of said rotating object located opposite the optical signal transmitter, in the region of the optical axis of the signal transmitter and the sensor, the rotating object being formed with a diametrically extending bore having an entrance window for the light beam and an opposite exit window for the light beam, a slit diaphragm arranged in vicinity of the exit window, and an objective for focusing the light beam onto the slit diaphragm arranged in vicinity of the entrance window, the slit of the slit diaphragm being aligned with a transverse extent thereof at least approximately perpendicularly to an axis of rotation of the rotating object.

In accordance with another feature of the invention, the light source is a laser diode.

In accordance with a further feature of the invention, the sensor is a photodiode.

In accordance with an added feature of the invention, the signal transmitter has a collimator arranged on the optical axis.

In accordance with an additional feature of the invention, the collimator is formed as a member selected from a group consisting of an achromat, a plano-convex lens and an aspherical lens, respectively.

In accordance with yet another feature of the invention, the collimator is arranged so that it is displaceable in the direction of the optical axis.

In accordance with yet a further feature of the invention, the objective and the slit diaphragm are arranged so that they are displaceable inside the bore.

In accordance with a concomitant feature of the invention, one of the objective and the slit diagram, respectively, is arranged so that it is displaceable inside the bore.

Other features which are considered as characteristic for the invention are set forth in the appended claims.

Although the invention is illustrated and described herein as embodied in a device for detecting the position of rotating objects, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, wherein:

DESCRIPTION OF THE PREFERRED EMBODIMENTS

Figure 1:
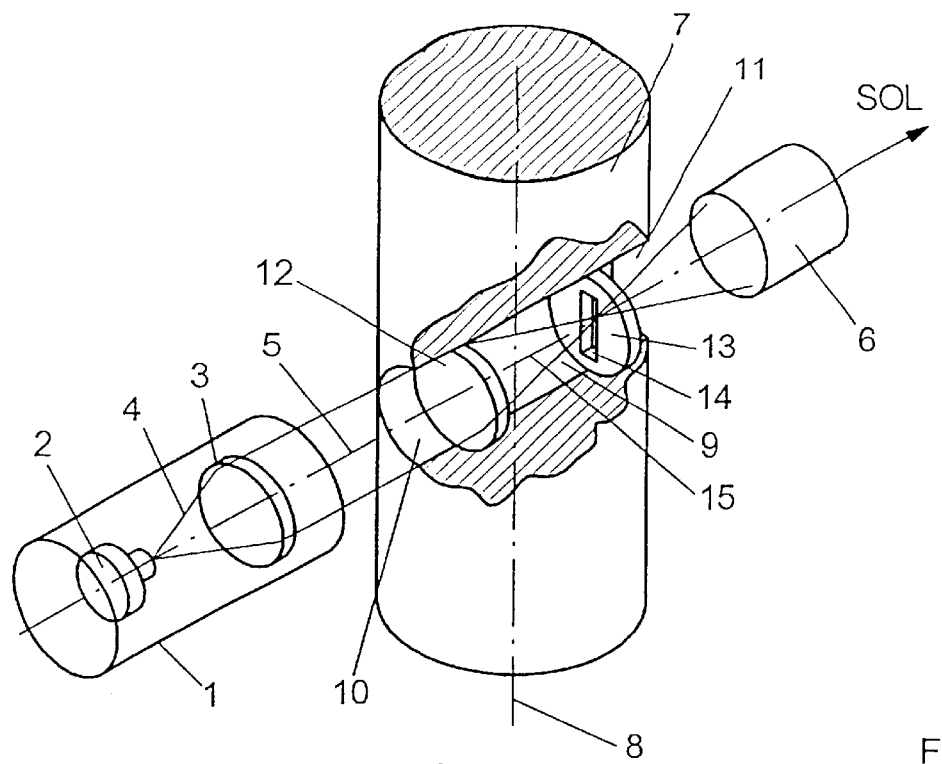
FIG. 1 is a diagrammatic perspective view, partly broken away and in section, of a device for detecting the position of a rotating object in accordance with the invention, illustrating the construction principle thereof.

Referring now to the drawings and, first, particularly to FIG. 1 thereof, there is illustrated therein the principle of construction of the device for detecting the position of a rotating object according to the invention, the device being called a position-detecting device for short. The Position-detecting device has a stationary optical signal transmitter 1 with a light source 2 and a collimator 3. The light source 2 generates a light beam 4, collimated by the collimator 3, along an optical axis 5. An optical sensor 6 is arranged in a stationary position opposite the optical signal transmitter 1 on the optical axis 5.

Located between the optical signal transmitter 1 and the optical sensor 6 is a rotating object in the form of a shaft 7 having an axis of rotation 8 aligned at least virtually perpendicularly to the optical axis 5. In the region wherein the optical signal transmitter 1 and the optical sensor 6 are situated opposite one another on the optical axis 5, the shaft 7 is formed with a diametrically extending bore 9 with an entrance window 10 and an exit window 11 for the light beam 4. An objective 12 is arranged in the bore 9 in the vicinity of the entrance window 10, and a slit diaphragm 13 formed with a slit 14 is arranged in the bore 9 in the vicinity of the exit window 11. The light beam 4 incident through the entrance window 10 is focused onto the slit diaphragm 13 by the objective 12. The slit 14 of the slit diaphragm 13 is aligned in a manner that the longitudinal extent thereof extends in the direction of the axis of rotation 8 of the shaft 7, and the transverse extent (slit width) thereof extends perpendicularly thereto. The objective 12 and/or the slit diaphragm (13) can be arranged so that they are displaceable inside the bore 9 in the direction of the center line 15.

In that angular position of the shaft 7 wherein the optical axis 5 of the light beam 4 coincides with the optical axis 15 of the objective 12 and the slit diaphragm 13, the light beam 4 generated in the optical signal transmitter 1 is respectively incident on the optical sensor 6 through the slit 14 of the slit diaphragm 13. The optical sensor 6, therefore, generates once per revolution of the shaft 7 an electric reference pulse, also known as "start-off line pulse" or, in short, "SOL pulse", which detects a defined angular position of the shaft 7.

A high edge steepness of the reference pulse, and thus a high accuracy in the detection of the angular position of the shaft 7 are attained in an advantageous manner by the fact that the light beam 4 traverses the slit 14 as a shading element for the optical sensor 6.

The light source 2 is preferably a single-mode light source, for example a laser diode. A photodiode, for example, can be used as the optical sensor 6. The collimator 3 can be constructed as an achromat or achromatic objective, or as a plano-convex and aspherical or non-spherical lens, respectively. In order to adjust the focal plane onto the slit 12 of the slit diaphragm 13, the collimator 3 can be arranged in the optical signal transmitter 1 so that it is displaceable along the optical axis 5.

Figure 2:
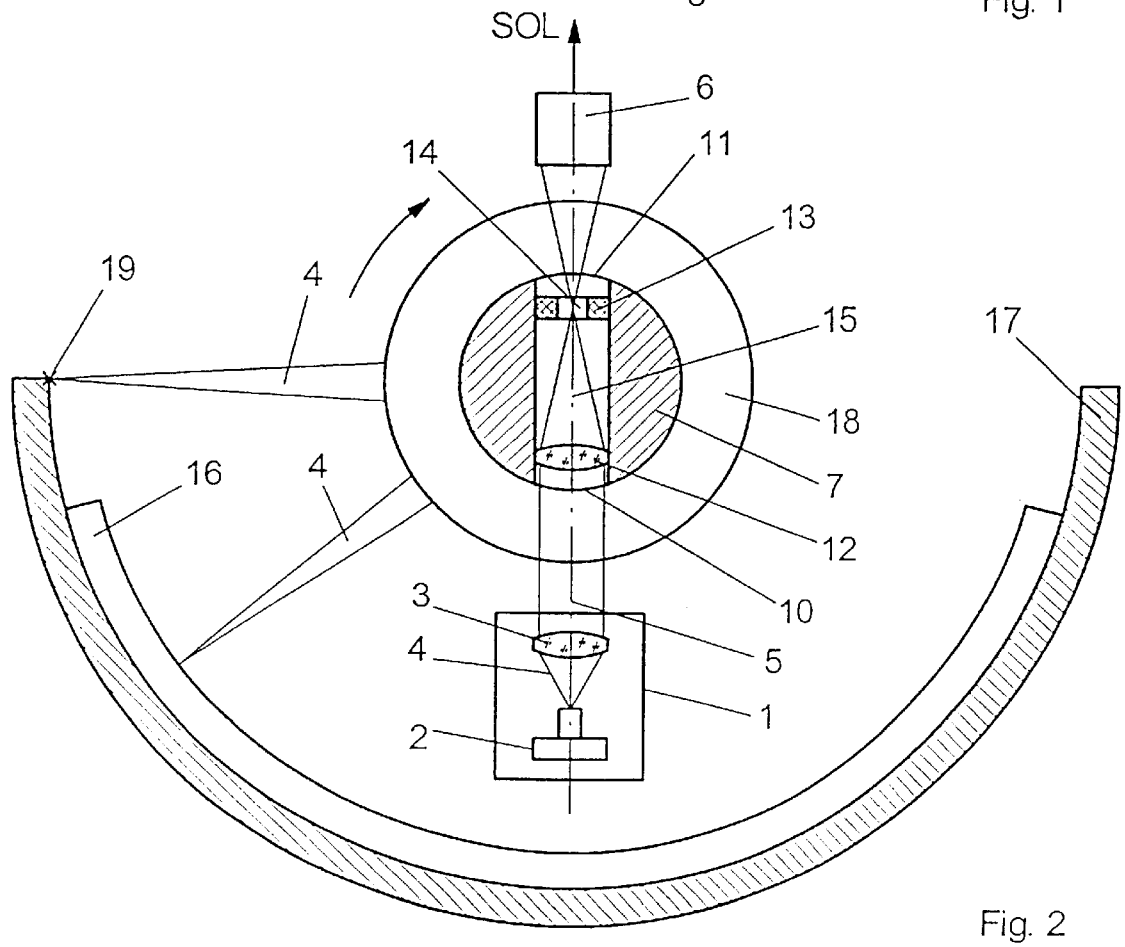
FIG. 2 is a diagrammatic cross-sectional view of the position-detecting device in an exemplary application with an internal drum-recorder.

FIG. 2 illustrates an example of the application of the device according to the invention for position detecting in the case of an internal drum recorder. In the otherwise non-illustrated internal drum recorder, a recording material 16 that is to be exposed is fixed on the inner surface of a stationary half shell or exposure trough 17. The pixel-wise or line-wise exposure of the recording material 16 is performed by the light beam 4, which is brightness-modulated with the information to be exposed. The light beam 4 is guided in a pixel-wise and line-wise manner over the recording material 16 by a light-beam deflecting device 18 coupled to the rotating shaft 7, the respective start of a line on the recording material 16 being signaled by the SOL pulse, which is generated once per revolution of the shaft 7 at a defined angular position of the shaft 7.

The position-detecting device according to FIG. 1, which generates the SOL pulse, is present in the region of the shaft 7 for the purpose of detecting the defined angular position of the rotating shaft 7 or the light beam 4 relative to a fixed reference point 19 on the exposure trough 17.

We claim:

1. A device for detecting the position of rotating objects, having an optical signal transmitter and an optical sensor, comprising a stationary light source included in the optical signal transmitter for generating along an optical axis a light beam directed onto a rotating object, the optical sensor being stationary and being arranged on said optical axis on a side of said rotating object located opposite the optical signal transmitter, in the region of said optical axis of the signal transmitter and the sensor, said rotating object being formed with a diametrically extending bore having an entrance window for said light beam and an opposite exit window for said light beam, a slit diaphragm arranged in vicinity of said exit window, and an objective for focusing said light beam onto said slit diaphragm arranged in vicinity of said entrance window, said slit of said slit diaphragm being aligned with a transverse extent thereof at least approximately perpendicularly to an axis of rotation of said rotating object.

2. The position-detecting device according to claim 1, wherein said light source is a laser diode.

3. The position-detecting device according to claim 1, wherein the sensor is a photodiode.

4. The position-detecting device according to claim 1, wherein the signal transmitter has a collimator arranged on said optical axis.

5. The position-detecting device according to claim 4, wherein said collimator is formed as a member of a group consisting of an achromat, a plano-convex lens and an aspherical lens, respectively.

6. The position-detecting device according to claim 4, wherein said collimator is arranged so that it is displaceable in the direction of said optical axis.

7. The position-detecting device according to claim 1, wherein said objective and said slit diaphragm are arranged so that they are displaceable inside said bore.

8. The position-detecting device according to claim 1, wherein one of said objective and said slit diagram, respectively, is arranged so that it is displaceable inside said bore.

* * * * *